(12) United States Patent
Umehara

(10) Patent No.: US 7,564,424 B2
(45) Date of Patent: Jul. 21, 2009

(54) ANTENNA HAVING MULTIPLE RADIATING ELEMENTS

(75) Inventor: Naoko Umehara, Takatsuki (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 453 days.

(21) Appl. No.: 11/430,029

(22) Filed: May 9, 2006

(65) Prior Publication Data

US 2006/0256030 A1   Nov. 16, 2006

(30) Foreign Application Priority Data

May 10, 2005   (JP)   ............... 2005-137522

(51) Int. Cl.
*H01Q 1/36*   (2006.01)

(52) U.S. Cl. ............... 343/895; 343/702; 343/876

(58) Field of Classification Search .......... 343/700 MS, 343/702, 895, 876
See application file for complete search history.

(56) References Cited

U.S. PATENT DOCUMENTS

| | | | |
|---|---|---|---|
| 5,914,691 A * | 6/1999 | Mandai et al. ............... | 343/728 |
| 6,040,806 A | 3/2000 | Kushihi et al. | |
| 6,388,626 B1 * | 5/2002 | Gamalielsson et al. ...... | 343/702 |
| 6,720,924 B2 | 4/2004 | Tomomatsu et al. | |
| 6,882,320 B2 * | 4/2005 | Park et al. ................... | 343/702 |
| 6,946,997 B2 | 9/2005 | Yuanzhu | |
| 7,148,851 B2 | 12/2006 | Takaki et al. | |
| 7,304,615 B2 * | 12/2007 | Nakamura ................... | 343/788 |
| 2002/0075186 A1 * | 6/2002 | Hamada et al. ........ | 343/700 MS |
| 2007/0109203 A1 * | 5/2007 | Park et al. ................... | 343/702 |

FOREIGN PATENT DOCUMENTS

| | | |
|---|---|---|
| JP | 11-068456 | 3/1999 |
| JP | 2001-036328 | 2/2001 |
| JP | 2002-111344 | 4/2002 |
| JP | 2002-319810 | 10/2002 |
| JP | 2003-037423 | 2/2003 |
| JP | 2003-298334 | 10/2003 |
| JP | 2004-274223 A | 9/2004 |
| JP | 2004-328237 A | 11/2004 |
| JP | 2005-20450 A | 1/2005 |
| JP | 2005-45599 A | 2/2005 |

* cited by examiner

*Primary Examiner*—Tan Ho
(74) *Attorney, Agent, or Firm*—Birch, Stewart, Kolasch & Birch, LLP

(57) ABSTRACT

An antenna includes a first radiating element (2a), a second radiating element (2b), a third radiating element (2c), a first switch element (7-1) for switching an electrical connection between the first radiating element (2a) and the second radiating element (2b), a second switch element (7-2) for switching an electrical connection between the second radiating element (2b) and the third radiating element (2c). The first radiating element (2a), the second radiating element (2b) and the third radiating element (2c) are conductor patterns formed on a dielectric member (1) that is separate from a printed circuit board (4) and has a dielectric constant larger than that of the printed circuit board (4).

35 Claims, 10 Drawing Sheets

ANTENNA HAVING MULTIPLE RADIATING ELEMENTS

This nonprovisional application claims priority under 35 U.S.C. § 119(a) on Patent Application No. 2005-137522 filed in Japan on May 10, 2005, the entire contents of which are hereby incorporated by reference.

BACKGROUND OF THE INVENTION

1. Field of the Invention

The present invention relates to an antenna that is used for a radio communication device or the like.

2. Description of Related Art

In recent years, small radio communication devices such as a cellular phone have been provided with various additional functions, and therefore frequency bands necessary for reception have been increased. Lately, a small radio communication device having a function of receiving a TV broadcast has become commercially practical, and such a small radio communication device needs to receive a TV broadcast frequency band.

In general, a length of an antenna corresponds to a wavelength of a signal to be received. The longer a wavelength (i.e., the lower a frequency) of a signal to be received is, the longer a length of the antenna is. UHF channels of TV broadcast use a frequency band of 470-770 MHz, while VHF channels of TV broadcast use a frequency band of 90-222 MHz. A domestic TV antenna that is installed on a roof includes radiating elements each of which has a length corresponding to a half wavelength ($\lambda/2$) of a TV broadcast signals. For example, a half wavelength ($\lambda/2$) of a TV broadcast signal of 500 MHz equal to 300 mm.

On the other hand, the small radio communication devices such as a cellular phone have become smaller. As a size of the small radio communication device is much smaller than a half wavelength ($\lambda/2$) of a TV broadcast signal, it is difficult to provide the small radio communication device with an antenna including radiating elements having lengths corresponding to a half wavelength ($\lambda/2$) of TV broadcast signals. In addition, it is desired to adopt a built-in antenna for improving a good appearance and portability of the small radio communication device. However, if a built-in antenna is adopted, a space available for the antenna will be very small.

Although a rod antenna is used for the conventional portable TV receivers, it is not suitable for a small radio communication device because of its long antenna length.

One type of the antenna that can solve the above-mentioned problem is disclosed in JP-A-2005-45599. This antenna has a wide band structure in which a zigzag conductor pattern is formed on a printed circuit board and is provided with a switch for connecting and disconnecting the conductor pattern. An antenna length is changed when the switch connects or disconnects the conductor pattern so that both the VHF band and the UVF band of TV broadcast can be received.

A usual printed circuit board has a relative dielectric constant of approximately 4.5, and the above-mentioned conductor pattern formed on the printed circuit board cannot produce sufficient contraction quantity of wavelength of a TV broadcast signal due to the relative dielectric constant of the printed circuit board, considering the frequency of the TV broadcast signal. Therefore, it is difficult to realize a substantially compact size by using the antenna disclosed in JP-A-2005-45599. In addition, the antenna disclosed in JP-A-2005-45599 includes a parasitic radiating element arranged on one side or each side of a feed conductor that is made up of the conductor pattern so that a resonance frequency is shifted to the low frequency side. However, this arrangement of the parasitic radiating element narrows a reception band. For this reason, the antenna disclosed in JP-A-2005-45599 is provided with a switch for connecting and disconnecting the conductor pattern. The switch connects or disconnects the conductor pattern so that the antenna length is changed and the reception frequency is also changed. However, if the number of the switches is small (for example, if only one switch is provided as shown in FIG. 10 of JP-A-2005-45599), it is difficult to cover a narrow reception band. In addition, it is not practical to provide a lot of switches from the viewpoint of cost or the like.

SUMMARY OF THE INVENTION

An object of the present invention is to provide an antenna that can be small and has a wide reception band.

An antenna according to the present invention includes at least two radiating elements and at least one switch element for switching an electrical connection between the radiating elements. At least one of the radiating elements is made up of conductor patterns formed on a dielectric member that is separated from a printed circuit board and has a dielectric constant larger than that of the printed circuit board.

According to this structure, a contraction quantity of wavelengths of a reception signal due to the relative dielectric constant of the dielectric member increases so that the antenna can be small. In addition, when the switch element is turned on and off, an antenna length as well as a resonance frequency is changed so that a reception band can be expanded.

In addition, the dielectric member may have a rectangular solid shape. Thus, the antenna can be structured in a three dimensional manner, which is effective for housing the antenna within a small space.

In addition, at last one of the radiating elements may have a zigzag pattern. Thus, a smaller size of the antenna can be realized.

In addition, the dielectric member may have a polyhedral shape, and at least one of the conductor patterns may have a zigzag pattern formed on a plurality of faces of the dielectric member. Thus, a smaller size of the antenna can be realized.

In addition, zigzag turning points of the conductor pattern may be formed on two faces that are farther from a ground pattern than other faces among a plurality of faces of the dielectric member. Thus, the conductor pattern can be kept away from the ground pattern.

In addition, at least two of the radiating elements may have zigzag patterns having zigzag pitches different from each other. In this way, an adjustable range of antenna impedance can be expanded.

In addition, at least one of the radiating elements may have a zigzag pattern with a nonuniform zigzag pitch. In this way, an adjustable range of antenna impedance can be expanded.

In addition, the zigzag pitch may become coarser as being farther from a feeding point. In this way, it is possible to form a zigzag pattern that is suitable for each reception frequency band.

In addition, at least one of the radiating elements may have a helical pattern. In this way, a smaller size of the antenna can be realized. If a desired small size is not achieved by using a zigzag pattern, a helical pattern is effective.

In addition, at least two of the radiating elements may have helical patterns having helical pitches different from each other. In this way, an adjustable range of antenna impedance can be expanded.

In addition, at least one of the radiating elements may have a helical pattern with a nonuniform helical pitch. In this way, an adjustable range of antenna impedance can be expanded.

In addition, the helical pitch may become coarser as being farther from a feeding point. In this way, it is possible to form a helical pattern that is suitable for each reception frequency band.

In addition, the antenna may further include a connection land formed on the dielectric member. In this way, it becomes easy to mount the dielectric member on a printed circuit board.

In addition, a part of the conductor pattern may work as the connection land for at least one of the conductor patterns. In this way, a surface area of the dielectric member can be utilized efficiently.

In addition, at least two of the radiating elements may be conductor patterns formed on a dielectric member that is separated from the printed circuit board and has an dielectric constant larger than that of the printed circuit board, the conductor patterns being formed on the same dielectric member. In this way, a smaller size of the antenna can be realized, and the number of components can be reduced so that a cost reduction can be realized.

In addition, at least two of the radiating elements may be conductor patterns formed on dielectric members that are separated from the printed circuit board and have dielectric constants larger than that of the printed circuit board, the conductor patterns being formed on different dielectric members. In this way, a shape of the antenna can be adapted to be a shape for using a small space efficiently. At least two of the dielectric members may be dielectric members having different shapes or dielectric members having different dielectric constants, or they may be arranged in such manner that longitudinal directions thereof are different from each other.

In addition, at least one of the dielectric members may have the longest side that is arranged substantially in parallel with at least one of sides constituting a rim of a ground pattern. This structure is effective for housing the antenna within a small space.

In addition, at least one of the radiating elements may be made up of a conductive wire or a conductive plate. In this way, the dielectric member can be small, and flexibility in a shape of the antenna is increased. Then, if one of the radiating elements is made up of a conductive wire or a conductive plate and constitutes an end of the antenna that is not connected to a feeding point, flexibility in a shape of the antenna is further increased. In addition, if the antenna is housed in a case, it is preferable to make at least one of the radiating elements as a conductive wire or a conductive plate having a shape adapted to the case so that a shape of the antenna can be adapted to be housed in the case easily.

In addition, at least one of the radiating elements may have a stub portion. In this way, it is possible to obtain an effect that an adjustable range of antenna impedance is expanded.

In addition, at least one of the radiating elements may have at least one of a tapered portion, a patch portion and a loop portion. In this way, it is possible to obtain an effect that a band width of reception frequencies is expanded.

In addition, the conductor pattern may have a portion having a width different from other conductor pattern width. In this way, adjustment of antenna impedance becomes easy.

In addition, the antenna may include at least one coil that is provided inside the radiating element or is connected electrically to the radiating element. In this way, a resonance frequency of the antenna is shifted to the low frequency side, so that the antenna can be further downsized.

In addition, the switch element may be a PIN diode that is turned on and off for switching the electrical connection between the radiating elements. Alternatively, the switch element may be a field effect transistor that is turned on and off for switching the electrical connection between the radiating elements. In this way, a resonance frequency of the antenna can be controlled by an electric signal.

In addition, the dielectric member may be mounted on a printed circuit board that does not include a circuit for processing a signal received by the antenna, and the printed circuit board on which the dielectric member is mounted may have input and output terminals for external connections. In this way, the antenna can be made a module so that flexibility of the antenna is increased.

In addition, at least one of the radiating elements may have a whole or a part of the element that is formed on the printed circuit board on which the dielectric member is mounted. In this way, a height of the antenna module is nearly equal to a thickness of the printed circuit board at the portion where a whole or a part of the radiating elements is made up of the conductor patterns on the printed circuit board. Therefore, this structure is effective if there is a restriction of height of the antenna partially.

In addition, the printed circuit board on which the dielectric member is mounted may be a flexible printed circuit board. In this way, it is easy to realize a shape of antenna that is effective for housing the antenna in a small space.

In addition, at least one of the switch elements may be mounted on the dielectric member. In this way, a smaller size of the antenna can be realized.

DESCRIPTION OF THE PREFERRED EMBODIMENTS

Hereinafter, preferred embodiments of the present invention will be described with reference to the attached drawings. In this specification supposing that an antenna includes N radiating elements, they are referred to as a first radiating element, a second radiating element, . . . , an N-th radiating element from the side close to a feeding point. Similarly, switch elements are referred to as a first switch element, a second switch element, . . . , a (N−1)th switch element from the side close to the feeding point.

Figure 1:
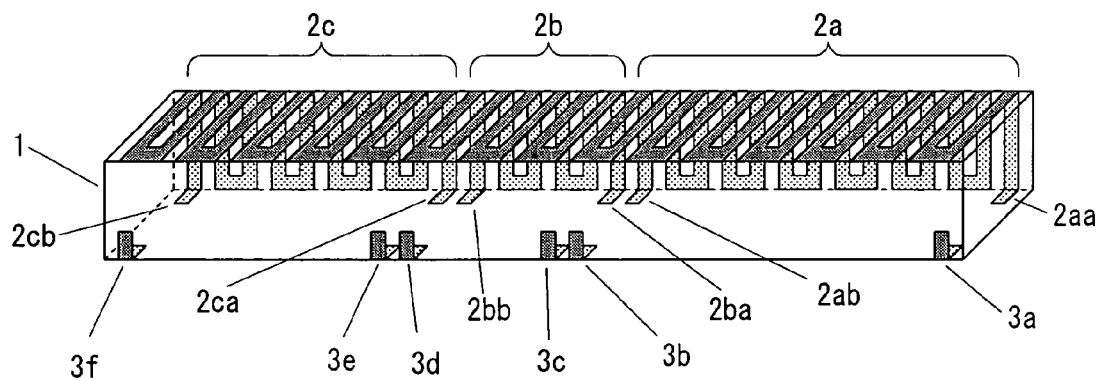
FIG. 1 is a perspective view of a dielectric member on which radiating elements are formed, which constitute an antenna according to a first embodiment of the present invention.
Figure 2:
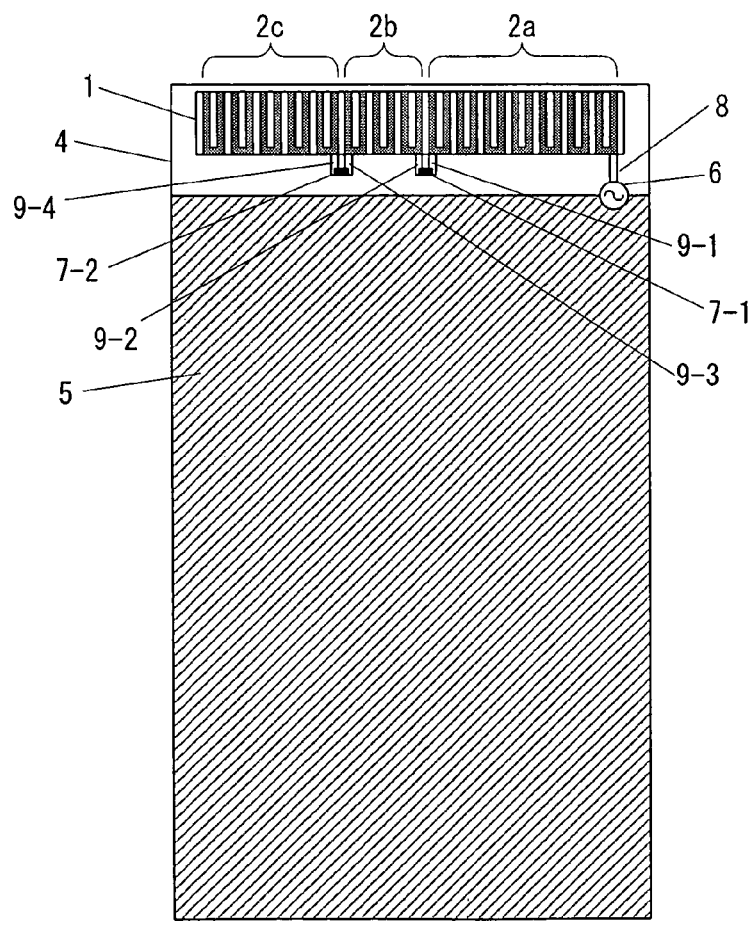
FIG. 2 is a top view of a printed circuit board on which the antenna is mounted according to the first embodiment of the present invention.
Figure 3:
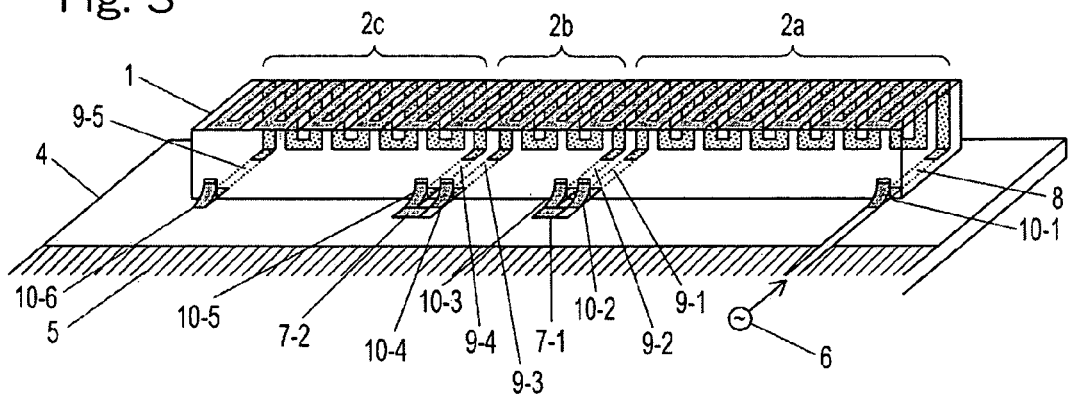
FIG. 3 is a partial perspective view showing an antenna mount portion of the printed circuit board on which the antenna is mounted according to the first embodiment of the present invention.

First, an antenna according to a first embodiment of the present invention will be described with reference to FIGS. 1-3. FIG. 1 is a perspective view of a dielectric member on which radiating elements are formed, which constitute the antenna according to the first embodiment of the present invention. In FIG. 1, the dielectric member is shown as transparent for a purpose of understanding a shape of the radiating elements easily. This is adapted to other drawings in the same way. FIG. 2 is a top view of a printed circuit board on which the antenna is mounted according to the first embodiment of the present invention. FIG. 3 is a partial perspective view showing an antenna mount portion of the printed circuit board on which the antenna is mounted according to the first embodiment of the present invention.

The antenna according to the first embodiment of the present invention includes a first radiating element 2a, a second radiating element 2b, a third radiating element 2c, a first switch element 7-1, a second switch element 7-2, conductor patterns 8, 9-1 through 9-5 on a printed circuit board 4, connection lands 3a-3f, soldered portions 10-1 through 10-6 (see FIGS. 1-3).

Three radiating elements (i.e., the first radiating element 2a, the second radiating element 2b and the third radiating element 2c) are formed on a dielectric member 1 having a rectangular solid shape. Each of the first radiating element 2a, the second radiating element 2b and the third radiating element 2c is a conductor pattern having a zigzag shape formed on a plurality of faces of the dielectric member 1 (see FIG. 1). In addition, a dielectric constant of the dielectric member 1 is set to a value larger than a dielectric constant of the printed circuit board 4. For example, a relative dielectric constant of the printed circuit board 4 is set to a value of approximately 4.5, while a relative dielectric constant of the dielectric member 1 is set to a value of 20 or more. In this structure, a contraction quantity of wavelengths of a reception signal due to the relative dielectric constant of the dielectric member 1 increases so that the antenna can be small.

The printed circuit board 4 is a main printed circuit board on which a main electronic circuit of a small radio communication device is mounted, which has the antenna according to the first embodiment of the present invention. The first switch element 7-1, the second switch element 7-2, the dielectric member 1 and other components are mounted on the printed circuit board 4.

A connection land 2aa that is a part of the first radiating element 2a is connected electrically to a feeding point 6 on the printed circuit board 4 via a conductor pattern 8 on the printed circuit board 4. A connection land 2ab that is a part of the first radiating element 2a is connected electrically to an end of the first switch element 7-1 via a conductor pattern 9-1 on the printed circuit board 4 (see FIGS. 1 and 3).

In addition, a connection land 2ba that is a part of the second radiating element 2b is connected electrically to the other end of the first switch element 7-1 via a conductor pattern 9-2 on the printed circuit board 4. A connection land 2bb that is a part of the second radiating element 2b is connected electrically to an end of the second switch element 7-2 via a conductor pattern 9-3 on the printed circuit board 4 (see FIGS. 1 and 3).

In addition, a connection land 2ca that is a part of the third radiating element 2c is connected electrically to the other end of the second switch element 7-2 via a conductor pattern 9-4 on the printed circuit board 4. A connection land 2cb that is a part of the third radiating element 2c is connected electrically to a conductor pattern 9-5 on the printed circuit board 4 (see FIGS. 1 and 3).

The first switch element 7-1 and the second switch element 7-2 can be made up of a PIN diode or a field effect transistor (FET), for example. The first switch element 7-1 constitutes a switch circuit together with a capacitor and a resister (not shown) disposed at the periphery thereof. The switch circuit is supplied with a control signal for controlling the first switch element 7-1 to be turned on and off. In addition, the second switch element 7-2 constitutes a switch circuit together with a capacitor and a resister (not shown) disposed at the periphery thereof. The switch circuit is supplied with a control signal for controlling the second switch element 7-2 to be turned on and off. If the switch element is made up of a field effect transistor (FET), the switch circuit has an advantage of low power consumption compared with a switch circuit including a switch element made up of a PIN diode.

In addition, zigzag turning points of the three radiating elements (the first radiating element 2a, the second radiating element 2b and the third radiating element 2c) are formed on two faces that are farther from a ground pattern 5 than other faces among six faces of the dielectric member 1 having a rectangular solid shape (see FIG. 3). In order to prevent a gain drop that may occur if the radiating element is close to the ground, it is desirable to arrange the antenna away from the ground as much as possible. However, if the antenna is disposed inside the small radio communication device, there may be some restrictions on the arrangement of the antenna so that it may be necessary to dispose the antenna close to the ground pattern. In this case, it is effective to adopt the above-mentioned arrangement of the radiating element that enables the three radiating elements (the first radiating element 2a, the second radiating element 2b and the third radiating element 2c) to be kept away from the ground pattern 5 as much as possible.

In addition, the dielectric member 1 is mounted on the printed circuit board 4 in such manner that the longest side of the dielectric member 1 having a rectangular solid shape is substantially parallel with at least one of sides that constitute the outer rim of the ground pattern 5 (see FIGS. 2 and 3). This arrangement of the dielectric member is effective for housing the antenna according to the first embodiment of the present invention within a small space inside the small radio communication device.

Figure 14:
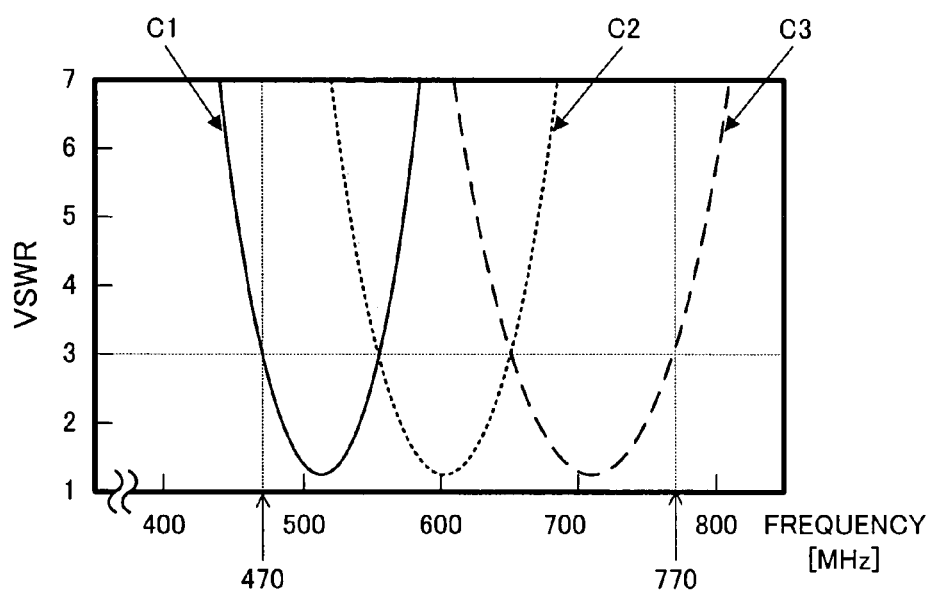
FIG. 14 is a graph showing an example of VSWR characteristics of the antenna according to the first embodiment of the present invention.

The antenna according to the first embodiment of the present invention can change its antenna length and switch its resonance frequency by switching a connection between the first radiating element 2a and the second radiating element 2b by the first switch element 7-1 and by switching a connection between the second radiating element 2b and the third radiating element 2c by the second switch element 7-2. For example, if the antenna according to the first embodiment of the present invention is set to be an antenna for receiving a signal of 470-770 MHz that is the UHF band of TV broadcast, the VSWR characteristics (voltage standing wave ratio characteristics) are as shown in FIG. 14. In FIG. 14, C1 shows a VSWR characteristics curve when both the first switch element 7-1 and the second switch element 7-2 are turned on, C2 shows a VSWR characteristics curve when the first switch element 7-1 is turned on while the second switch element 7-2 is turned off, and C3 shows a VSWR characteristics curve when both the first switch element 7-1 and the second switch element 7-2 are turned off. The wide band range of 470-770 MHz cannot be covered by a single VSWR characteristics curve. However, when the first switch element 7-1 and the second switch element 7-2 are switched to be turned on or off so as to change the antenna length, the VSWR characteristics curve is shifted so that the antenna having the wide reception band can be realized.

Figure 4A:
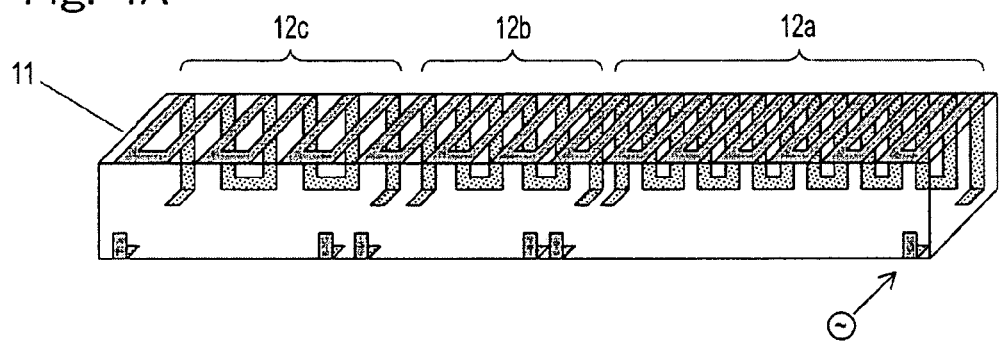
FIG. 4A is a perspective view of a dielectric member on which radiating elements are formed, which constitute an antenna according to a second embodiment of the present invention.

Next, an antenna according to a second embodiment of the present invention will be described with reference to FIG. 4A. FIG. 4A is a perspective view of a dielectric member on which radiating elements are formed, which constitute the antenna according to the second embodiment of the present invention.

The antenna according to the second embodiment of the present invention is obtained by replacing the dielectric member 1 of the antenna according to the first embodiment of the present invention with a dielectric member 11. There is a small difference between the antenna according to the first embodiment of the present invention and the antenna according to the second embodiment of the present invention concerning a position of conductor patterns on the printed circuit board, but a detailed description about this difference will be omitted.

Three radiating elements (i.e., a first radiating element 12a, a second radiating element 12b and a third radiating element 12c) are formed on the dielectric member 11 having a rectangular solid shape. Each of the first radiating element 12a, the second radiating element 12b and the third radiating element 12c is formed as a zigzag conductor pattern extending on a plurality of faces of the dielectric member 11. In addition, a pitch of the zigzag pattern is different among the first radiating element 12a, the second radiating element 12b and the third radiating element 12c. The farther from the feeding point the radiating element is, the larger the zigzag pitch is. In other words, the first radiating element 12a has the smallest zigzag pitch, while the third radiating element 12c has the largest zigzag pitch.

The antenna according to the second embodiment of the present invention can switch its resonance frequency for supporting a wide reception band using a first switch element for switching a connection between the first radiating element 12a and the second radiating element 12b and using a second switch element for switching a connection between the second radiating element 12b and the third radiating element 12c so as to change its antenna length. In other words, a frequency of a reception signal can be changed substantially in accordance with states of the first switch element and the second switch element.

If the zigzag pitch of the radiating element is set uniformly dense to be adapted to the case where a reception signal has high frequencies (i.e., short wavelengths), it is difficult to resonate at an assumed frequency in the state where both the first switch element and the second switch element are turned on, i.e., the state adapted to a reception signal having low frequencies (i.e., long wavelengths) because the zigzag pattern is observed as a bunch of zigzag for wavelengths of the reception signal. On the other hand, if the zigzag pitch of the radiating element is set uniformly coarse to be adapted to the case where a reception signal has low frequencies (i.e., long wavelengths), a size of antenna becomes large.

Therefore, the zigzag pitch in the antenna according to the second embodiment of the present invention has a nonuniform zigzag pitch that is coarser as the radiating element is farther from the feeding point. In this way, the zigzag pattern is not observed as a bunch of zigzag even if the reception signal has low frequencies (i.e., long wavelengths), and thus a small antenna can be realized that is adapted to frequencies corresponding to states of the first switch element and the second switch element.

Figure 4B:
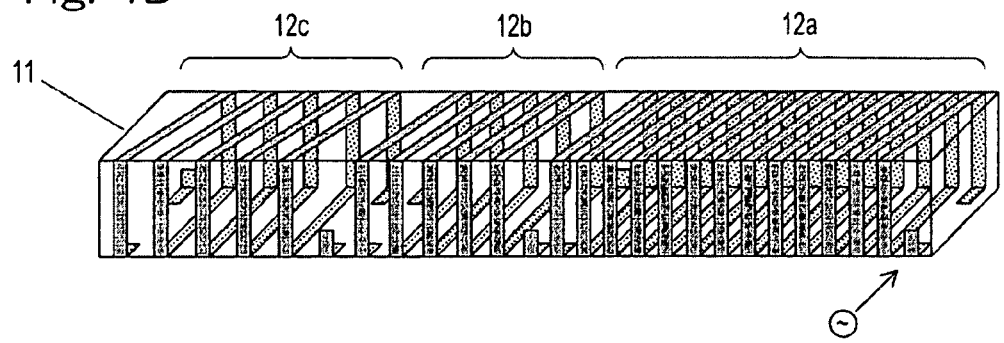
FIG. 4B is a perspective view of a dielectric member on which radiating elements are formed, of which at least two of the radiating elements have helical patterns having helical pitches different from each other, which constitute an antenna according to a second embodiment of the present invention.

In addition, the zigzag pattern of the three radiating elements (the first radiating element 12a, the second radiating element 12b and the third radiating element 12c) can be replaced with a helical pattern (see FIG. 4B). In this case, the first radiating element, the second radiating element and the third radiating element are formed to be radiating elements having helical patterns of different helical pitches. More specifically, the farther from the feeding point the radiating element is, the coarser the helical pitch is. In other words, the first radiating element has the densest helical pitch, while the third radiating element has the coarsest helical pitch. In this way, the helical pattern is not observed as a bunch of helical pattern even if the reception signal has low frequencies (i.e., long wavelengths), and thus a small antenna can be realized that is adapted to frequencies corresponding to states of the first switch element and the second switch element.

Figure 5:
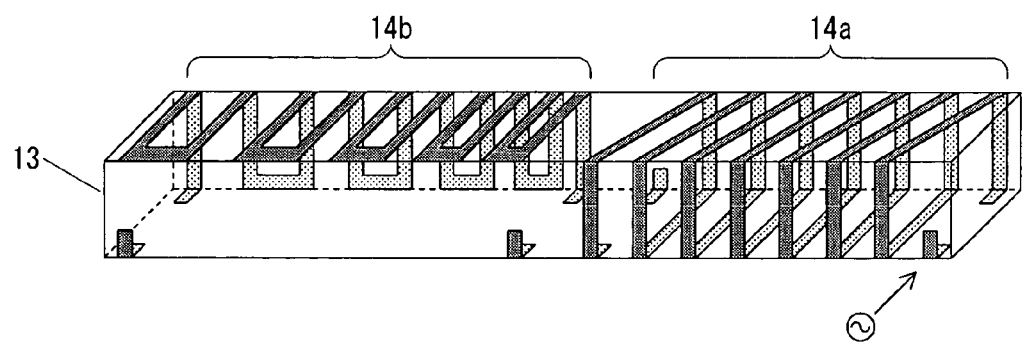
FIG. 5 is a perspective view of a dielectric member on which radiating elements are formed, which constitute an antenna according to a third embodiment of the present invention.

Next, an antenna according to a third embodiment of the present invention will be described with reference to FIG. 5. FIG. 5 is a perspective view of a dielectric member on which radiating elements are formed, which constitute the antenna according to the third embodiment of the present invention.

The antenna according to the third embodiment of the present invention is obtained by replacing the dielectric member 1 of the antenna according to the first embodiment of the present invention with a dielectric member 13. There are small differences between the antenna according to the first embodiment of the present invention and the antenna according to the second embodiment of the present invention concerning the number and a position of conductor patterns as well as the number and a position of switch elements of the printed circuit board, but a detailed description about these differences will be omitted.

Two radiating elements (i.e., a first radiating element 14a and a second radiating element 14b) are formed on the dielectric member 13 having a rectangular solid shape. The first radiating element 14a that is a conductor pattern having a helical pattern and the second radiating element 14b that is a conductor pattern having a zigzag pattern are formed on a plurality of faces of the dielectric member 13.

In addition, a zigzag pitch of the second radiating element 14b is not uniform. Since a zigzag pitch of a radiating element affects antenna impedance observed from a feeding point, an adjustable range of the antenna impedance can be increased if the zigzag pitch of the radiating element is not uniform.

In addition, if at least one of radiating elements has a helical pattern like this embodiment, the antenna can be smaller. However, a use of a radiating element having a helical pattern may narrow a band width of reception frequencies of the antenna. Therefore, it is preferable to consider occasional conditions for downsizing and realizing a wide band width of reception frequencies for determining a specification and to use properly a radiating element having a zigzag pattern or a radiating element having a helical pattern in accordance with the specification. It is effective for downsizing and realizing a wide band width of reception frequencies to form the pattern as a combination pattern as shown in FIG. 5. Although a helical pitch of the first radiating element 14*a* having a helical pattern is uniform in this embodiment, it is possible to use a radiating element having a helical pattern whose helical pitch is not uniform from a viewpoint of expanding an adjustable range of the antenna impedance.

Figure 6:
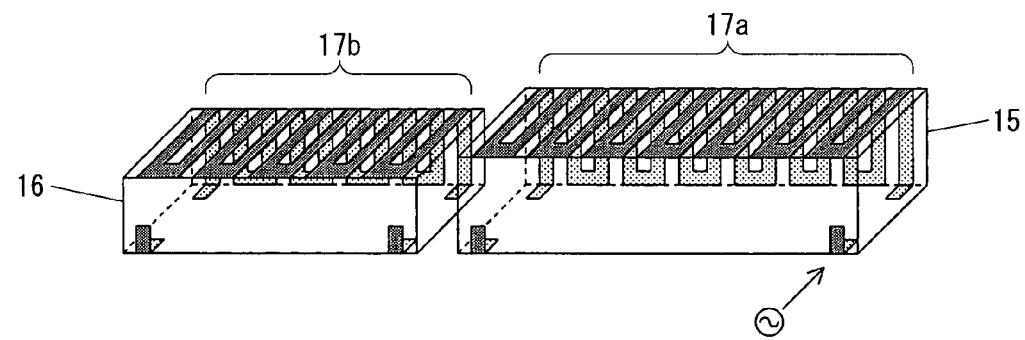
FIG. 6 is a perspective view of a dielectric member on which radiating elements are formed, which constitute an antenna according to a fourth embodiment of the present invention.
Figure 7:
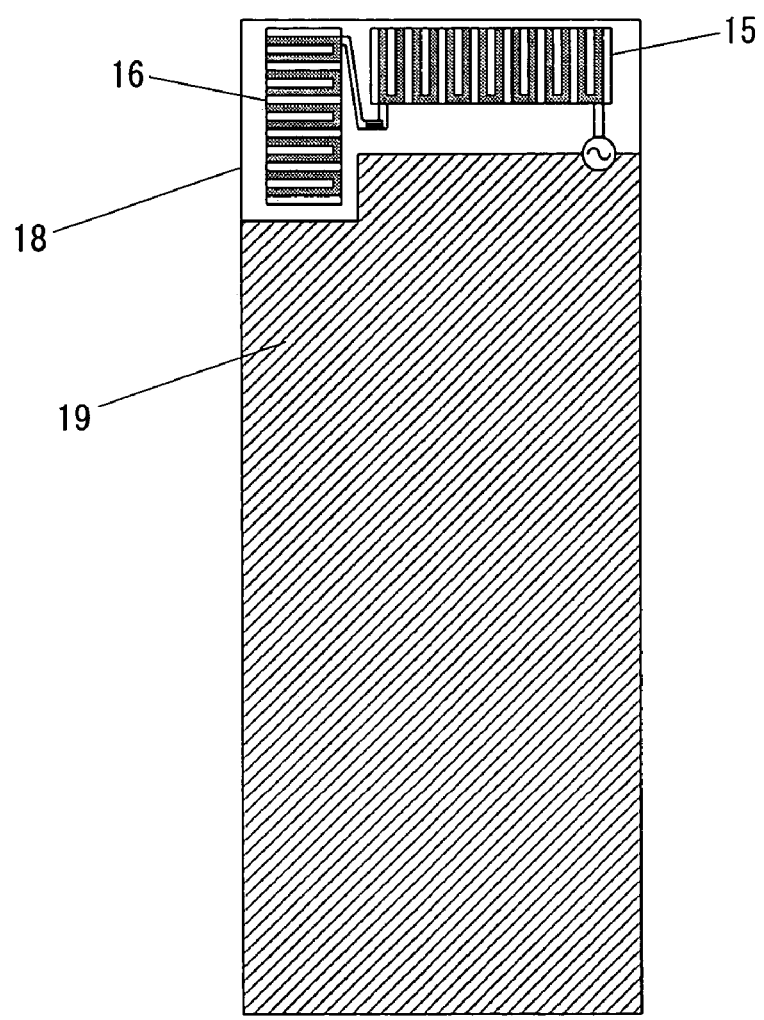
FIG. 7 is a top view of a printed circuit board on which the antenna is mounted according to the fourth embodiment of the present invention.

Next, an antenna according to a fourth embodiment of the present invention will be described with reference to FIGS. 6 and 7. FIG. 6 is a perspective view of a dielectric member on which radiating elements are formed, which constitute the antenna according to the fourth embodiment of the present invention. FIG. 7 is a top view of a printed circuit board on which the antenna is mounted according to the fourth embodiment of the present invention.

The antenna according to the fourth embodiment of the present invention is obtained by replacing the dielectric member I of the antenna according to the first embodiment of the present invention with dielectric members 15 and 16. There are small differences between the antenna according to the first embodiment of the present invention and the antenna according to the fourth embodiment of the present invention concerning the number and a position of conductor patterns as well as the number and a position of switch elements of the printed circuit board, but a detailed description about these differences will be omitted.

A first radiating element 17*a* is formed on the dielectric member 15 having a rectangular solid shape. The first radiating element 17*a* is a conductor pattern having a zigzag pattern that is formed on a plurality of faces of the dielectric member 15 (see FIG. 6). A second radiating element 17*b* is formed on the dielectric member 16 having a rectangular solid shape. The second radiating element 17*b* is a conductor pattern having a zigzag pattern that is formed on a plurality of faces of the dielectric member 16 (see FIG. 6). In addition, the dielectric member 15 and the dielectric member 16 have shapes different from each other (FIG. 6 see). This structure facilitates adjustment of a shape of the antenna to be suitable for utilizing a small space within a small radio communication device efficiently.

In addition, it is possible to set a dielectric constant of the dielectric member 15 and a dielectric constant of the dielectric member 16 to values different from each other. If a dielectric constant of the dielectric member is set to a large value, contraction quantity of wavelengths of a reception signal increases so that the antenna can be small. However, a band width of reception frequencies of the antenna is narrowed. It is preferable to consider occasional conditions for downsizing and realizing a wide band width of reception frequencies for determining a specification and to set dielectric constants of the dielectric members 15 and 16 in accordance with the specification.

In addition, the dielectric members 15 and 16 are mounted on a printed circuit board 18 so that the longitudinal direction of the dielectric member 15 having a rectangular solid shape is different from the longitudinal direction of the dielectric member 16 having a rectangular solid shape (see FIG. 7). Furthermore, a ground pattern 19 formed on the printed circuit board 18 has a shape that is adapted to an arrangement of the dielectric members 15 and 16 (see FIG. 7). This arrangement of the dielectric members is effective in the case where the printed circuit board 18 has an elongated shape as shown in FIG. 7 and it is difficult to arrange a single dielectric member on the printed circuit board if the dielectric member includes all radiating elements.

Figure 8:
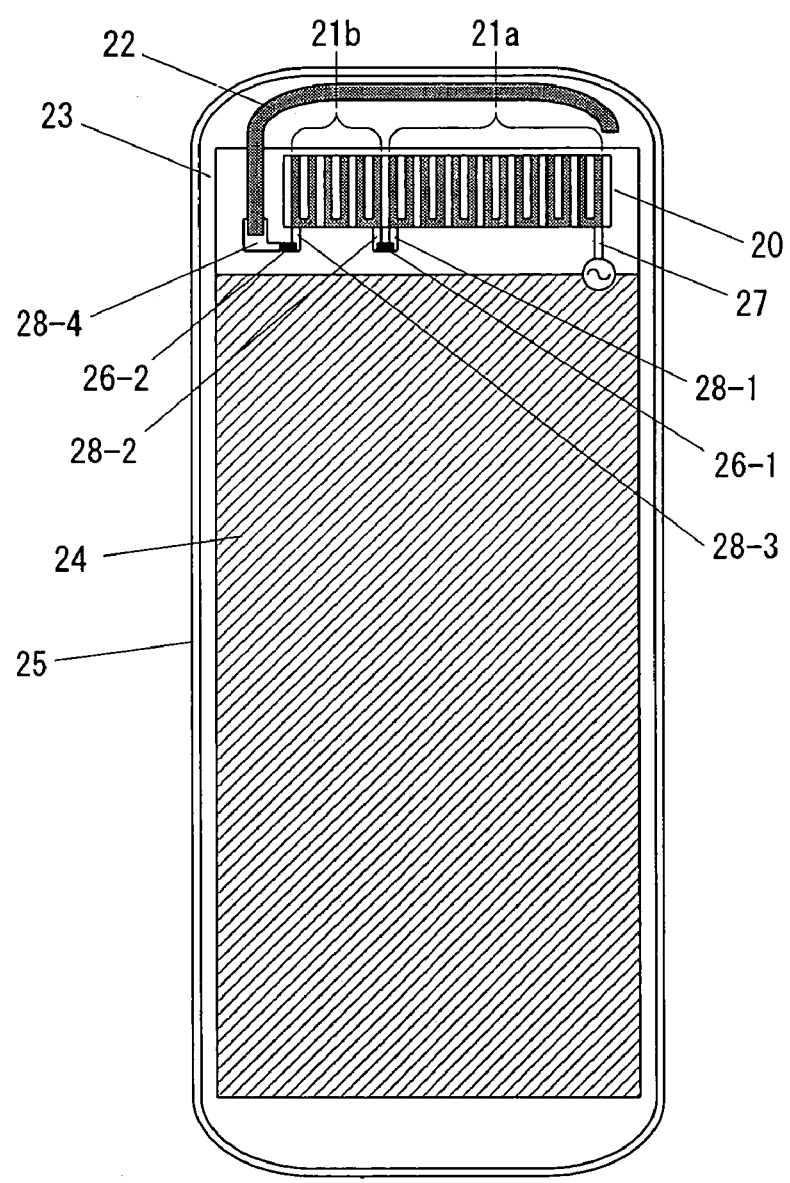
FIG. 8 is a top view of a printed circuit board on which an antenna is mounted according to a fifth embodiment of the present invention.

Next, an antenna according to a fifth embodiment of the present invention will be described with reference to FIG. 8. FIG. 8 is a top view of a printed circuit board on which an antenna is mounted according to a fifth embodiment of the present invention.

The antenna according to the fifth embodiment of the present invention includes a first radiating element 21*a*, a second radiating element 21*b*, a third radiating element 22, a first switch element 26-1, a second switch element 26-2, conductor patterns 27 and 28-1 through 28-4 on a printed circuit board 23, connection lands (not shown) and soldered portions (not shown).

Two radiating elements (i.e., the first radiating element 21*a* and the second radiating element 21*b*) are formed on a dielectric member 20 having a rectangular solid shape. Each of the first radiating element 21*a* and the second radiating element 21*b* is a conductor pattern having a zigzag pattern formed on a plurality of faces of the dielectric member 20. In addition, a dielectric constant of the dielectric member 20 is set to a value larger than a dielectric constant of the printed circuit board 23. For example, a relative dielectric constant of the printed circuit board 23 is set to a value of approximately 4.5, while a relative dielectric constant of the dielectric member 20 is set to a value of 20 or more. In this structure, a contraction quantity of wavelengths of a reception signal due to the relative dielectric constant of the dielectric member 20 increases so that the antenna can be small.

The printed circuit board 23 is a main printed circuit board on which a main electronic circuit of a small radio communication device is mounted, which has the antenna according to the fifth embodiment of the present invention. The first switch element 26-1, the second switch element 26-2, the dielectric member 20 and other components are mounted on the printed circuit board 23.

An end of the first radiating element 21*a* is connected electrically to a feeding point on the printed circuit board 23 via a conductor pattern 27 on the printed circuit board 23. The other end of the first radiating element 21*a* is connected electrically to an end of the first switch element 26-1 via a conductor pattern 28-1 on the printed circuit board 23. In addition, an end of the second radiating element 21*b* is connected electrically to the other end of the first switch element 26-1 via a conductor pattern 28-2 on the printed circuit board 23. The other end of the second radiating element 21*b* is connected electrically to an end of the second switch element 26-2 via a conductor pattern 28-3 on the printed circuit board 23. In addition, an end of the third radiating element 22 is connected electrically to the other end of the second switch element 26-2 via a conductor pattern 28-4 on the printed circuit board 23. In addition, a ground pattern 24 is also formed on the printed circuit board 23.

The third radiating element 22 is made of a conductor plate. In addition, the third radiating element 22 constitutes an end of the antenna on the side that is not connected to a feeding point. The first radiating element 21*a* constitutes an end of the antenna on the side that is connected to a feeding point. In addition, the third radiating element 22 has a shape adapted to a case 25 of the small radio communication device having the antenna according to the fifth embodiment of the present invention. In this structure, the dielectric member 20 can be small, and the third radiating element 22 can have a free shape within a range of permissible characteristics inside the case 25. Thus, it is possible to realize a compact shape that is effective for housing the antenna within a small space inside the small radio communication device. Although the first radiating element and the second radiating element can also be made up of a conductive plate, it is difficult to obtain an effect of a small size by using a dielectric member that is separate from the printed circuit board and has a larger dielectric constant than the printed circuit board. In this embodiment, since the first radiating element and the second radiating element do not have an open end, the first radiating element and the second radiating element are made up of conductive patterns formed on the dielectric member. Sine the third radiating element has an open end (i.e., an end of the antenna on the side that is not connected to a feeding point), the third radiating element is made of a conductive plate. The third radiating element is formed in a free direction in a free shape within a range of permissible characteristics, so as to realize an antenna that is small and easy to be housed in the case.

Figure 9:
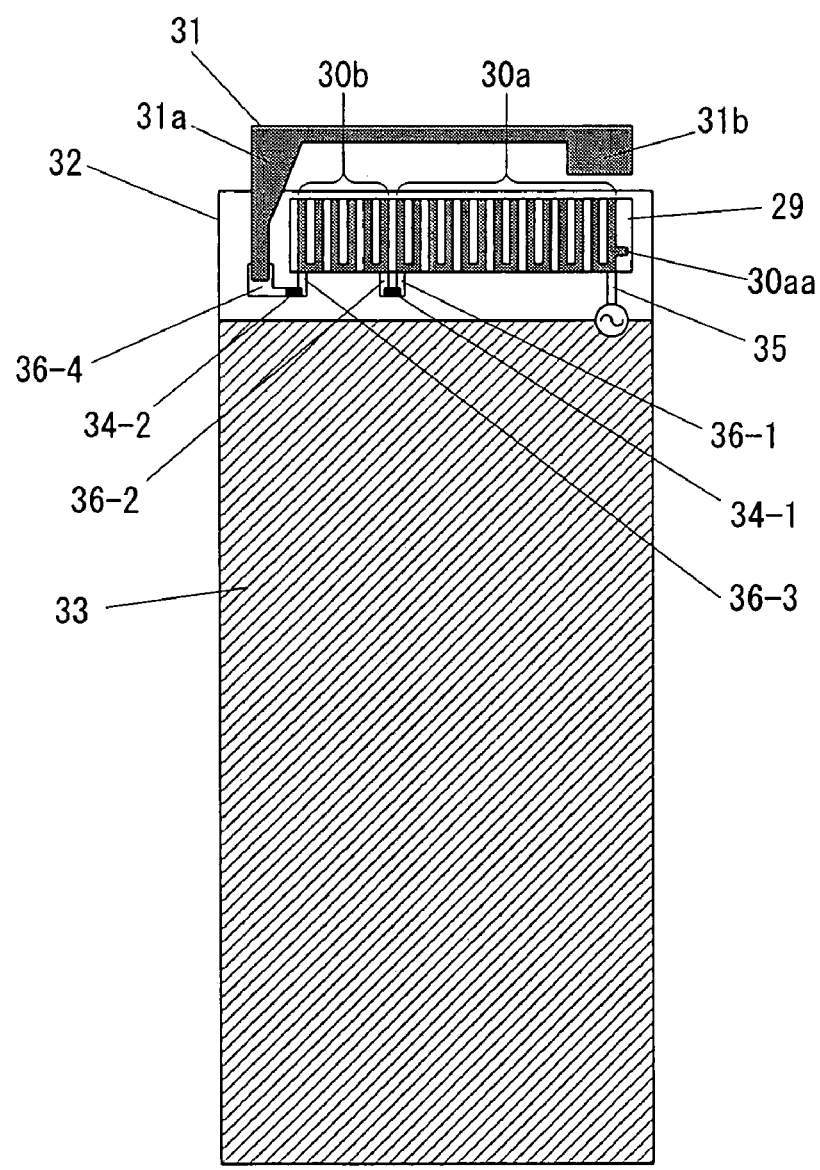
FIG. 9 is a top view of a printed circuit board on which an antenna is mounted according to a sixth embodiment of the present invention.

Next, an antenna according to a sixth embodiment of the present invention will be described with reference to FIG. 9. FIG. 9 is a top view of a printed circuit board on which an antenna is mounted according to a sixth embodiment of the present invention.

The antenna according to the sixth embodiment of the present invention includes a first radiating element 30a, a second radiating element 30b, a third radiating element 31, a first switch element 34-1, a second switch element 34-2, conductor patterns 35 and 36-1 through 36-4 on a printed circuit board 32, connection lands (not shown) and soldered portions (not shown).

Two radiating elements (i.e., the first radiating element 30a and the second radiating element 30b) are formed on a dielectric member 29 having a rectangular solid shape. Each of the first radiating element 30a and the second radiating element 30b is a conductor pattern having a zigzag pattern formed on a plurality of faces of the dielectric member 29. In addition, a dielectric constant of the dielectric member 29 is set to a value larger than a dielectric constant of the printed circuit board 32. For example, a relative dielectric constant of the printed circuit board 32 is set to a value of approximately 4.5, while a relative dielectric constant of the dielectric member 29 is set to a value of 20 or more. In this structure, a contraction quantity of wavelengths of a reception signal due to the relative dielectric constant of the dielectric member 29 increases so that the antenna can be small.

The printed circuit board 32 is a main printed circuit board on which a main electronic circuit of a small radio communication device is mounted, which has the antenna according to the sixth embodiment of the present invention. The first switch element 34-1, the second switch element 34-2, the dielectric member 29 and other components are mounted on the printed circuit board 32.

An end of the first radiating element 30a is connected electrically to a feeding point on the printed circuit board 32 via a conductor pattern 35 on the printed circuit board 32. The other end of the first radiating element 30a is connected electrically to an end of the first switch element 34-1 via a conductor pattern 36-1 on the printed circuit board 32. In addition, an end of the second radiating element 30b is connected electrically to the other end of the first switch element 34-1 via a conductor pattern 36-2 on the printed circuit board 32. The other end of the second radiating element 30b is connected electrically to an end of the second switch element 34-2 via a conductor pattern 36-3 on the printed circuit board 32. In addition, an end of the third radiating element 31 is connected electrically to the other end of the second switch element 34-2 via a conductor pattern 36-4 on the printed circuit board 32. In addition, a ground pattern 33 is also formed on the printed circuit board 32.

The first radiating element 30a includes a stub portion 30aa. Since the stub portion 3aa is provided, it is possible to obtain an effect that an adjustable range of antenna impedance is expanded.

In addition, the third radiating element 31 includes a tapered portion 31a. Since the tapered portion 31a is provided, it is possible to obtain an effect that a band width of reception frequencies is expanded.

In addition, the third radiating element 31 includes a patch portion 31b. Since the patch portion 31b is provided, it is possible to obtain an effect that a band width of reception frequencies is expanded.

Figure 10:
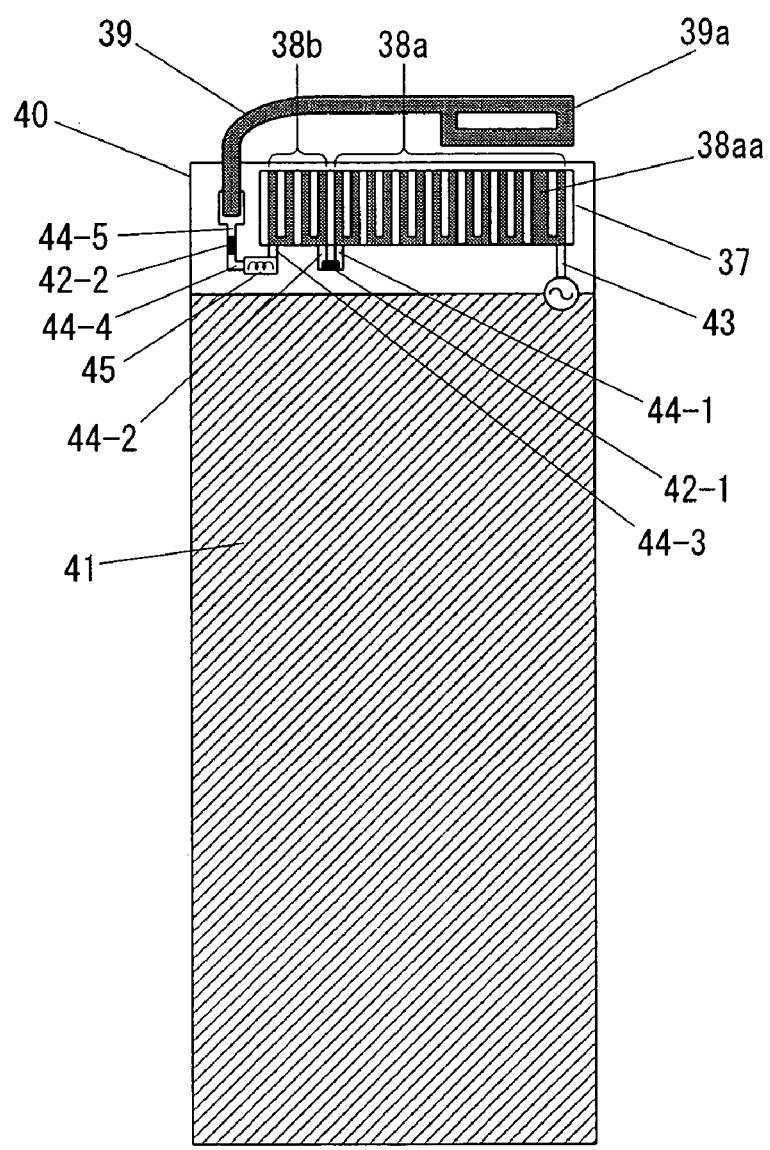
FIG. 10 is a top view of a printed circuit board on which an antenna is mounted according to a seventh embodiment of the present invention.

Next, an antenna according to a seventh embodiment of the present invention will be described with reference to FIG. 10. FIG. 10 is a top view of a printed circuit board on which an antenna is mounted according to a seventh embodiment of the present invention.

The antenna according to the seventh embodiment of the present invention includes a first radiating element 38a, a second radiating element 38b, a third radiating element 39, a first switch element 42-1, a second switch element 42-2, conductor patterns 43 and 44-1 through 44-5 on a printed circuit board 40, a coil 45, connection lands (not shown) and soldered portions (not shown).

Two radiating elements (i.e., the first radiating element 38a and the second radiating element 38b) are formed on a dielectric member 37 having a rectangular solid shape. Each of the first radiating element 38a and the second radiating element 38b is a conductor pattern having a zigzag pattern formed on a plurality of faces of the dielectric member 37. In addition, a dielectric constant of the dielectric member 37 is set to a value larger than a dielectric constant of the printed circuit board 40. For example, a relative dielectric constant of the printed circuit board 40 is set to a value of approximately 4.5, while a relative dielectric constant of the dielectric member 37 is set to a value of 20 or more. In this structure, a contraction quantity of wavelengths of a reception signal due to the relative dielectric constant of the dielectric member 37 increases so that the antenna can be small.

The printed circuit board 40 is a main printed circuit board on which a main electronic circuit of a small radio communication device is mounted, which has the antenna according to the seventh embodiment of the present invention. The first switch element 42-1, the second switch element 42-2, the dielectric member 37 and other components are mounted on the printed circuit board 40.

An end of the first radiating element 38a is connected electrically to a feeding point on the printed circuit board 40 via a conductor pattern 43 on the printed circuit board 40. The other end of the first radiating element 38a is connected electrically to an end of the first switch element 42-1 via a conductor pattern 44-1 on the printed circuit board 40. In addition, an end of the second radiating element 38b is connected electrically to the other end of the first switch element 42-1 via a conductor pattern 44-2 on the printed circuit board 40. The other end of the second radiating element 38b and an end of the coil 45 mounted on the printed circuit board 40 are connected electrically to each other via a conductor pattern 44-3 on the printed circuit board 40. In addition, the other end of the coil 45 mounted on the printed circuit board 40 and an end of the second switch element 42-2 are connected electrically to each other via a conductor pattern 44-4 on the printed circuit board 40. In addition, an end of the third radiating element 39 is connected electrically to the other end of the second switch element 42-2 via a conductor pattern 44-5 on the printed circuit board 40. In addition, a ground pattern 41 is also formed on the printed circuit board 40.

The third radiating element 39 includes a loop portion 39a. Since the loop portion 39a is provided, it is possible to obtain an effect that a band width of reception frequencies is expanded.

In addition, the first radiating element 38a includes a part 38aa having a pattern width different from other conductor pattern width (i.e., a conductor pattern width of the first radiating element 38a except for the part 38aa and a conductor pattern width of the second radiating element 38b). Thus, it becomes easy to adjust antenna impedance.

In addition, a coil 45 is disposed between the second radiating element 38b and the third radiating element 39. The coil 45 has an effect of shifting a resonance frequency of the antenna to the low frequency side. Therefore, the coil 45 is effective for downsizing antenna. The coil 45 may be a laminated chip coil or a wire-wound coil. The coil may be disposed between a radiating element and another radiating element as shown in FIG. 10 or at an end portion of a radiating element or a predetermined position within a radiating element.

Figure 11:
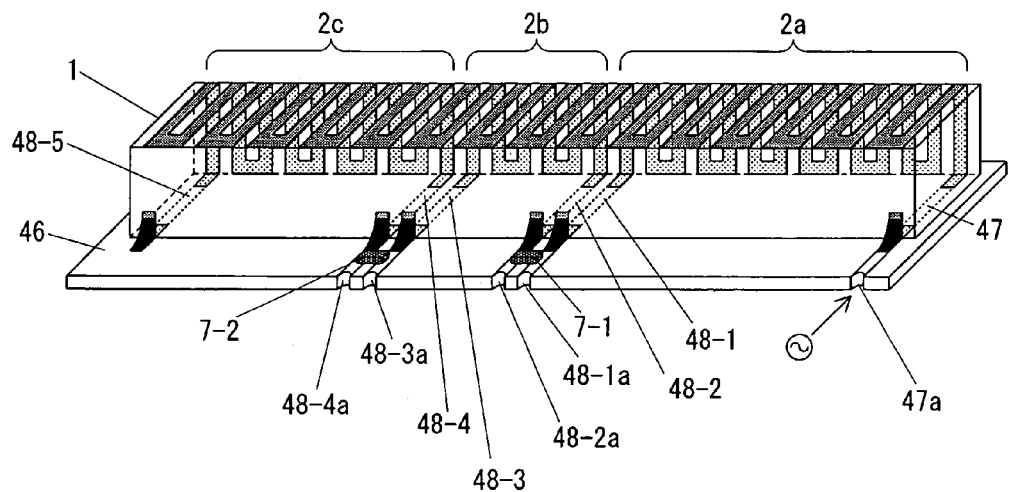
FIG. 11 is a perspective view of a whole antenna module on which an antenna is mounted according to an eighth embodiment of the present invention.

Next, an antenna according to an eighth embodiment of the present invention will be described with reference to FIG. 11. FIG. 11 is a perspective view of a whole antenna module on which an antenna is mounted according to a eighth embodiment of the present invention.

The antenna according to the eighth embodiment of the present invention includes a first radiating element 2a, a second radiating element 2b, a third radiating element 2c, a first switch element 7-1, a second switch element 7-2, conductor patterns 47 and 48-1 through 48-5 on a printed circuit board 46, connection lands and soldered portions.

The printed circuit board 46 is another printed circuit board separated from the main printed circuit board on which a main electronic circuit of a small radio communication device is mounted, which has the antenna according to the eighth embodiment of the present invention. The first switch element 7-1, the second switch element 7-2, the dielectric member 1 and other components are mounted on the printed circuit board 46.

In addition, the conductor pattern 47 includes an end face through hole 47a, while the conductor patterns 48-1, 48-2, 48-3 and 48-4 include end face through holes 48-1a, 48-2a, 48-3a and 48-4a, respectively. The end face through hole 47a becomes a terminal of the antenna module to be connected to a feeding point. One of the end face through holes 48-1a and 48-2a becomes an antenna control terminal for entering an on/off signal while the other becomes a ground terminal if the first switch element 7-1 is made up of a PIN diode, for example. A part of components constituting a switch circuit, e.g., a resister for determining current flowing through the PIN diode, may be arranged on the printed circuit board 46 or on the main printed circuit board. The end face through holes 48-3a and 48-4a are structured similarly to the end face through holes 48-1a and 48-2a. Making the antenna as a module as shown in FIG. 11, flexibility of the antenna is increased. Although the terminals of the antenna module are made up of the end face through holes in FIG. 11, it is possible to provide a connector or the like for the terminals instead of the end face through holes.

Three radiating elements (the first radiating element 2a, the second radiating element 2b and the third radiating element 2c) are formed on the dielectric member 1 having a rectangular solid shape. Each of the first radiating element 2a, the second radiating element 2b and the third radiating element 2c is formed as a zigzag conductor pattern extending on a plurality of faces of the dielectric member 1. In addition, a dielectric constant of the dielectric member 1 is set to a value larger than a dielectric constant of the printed circuit board 46. For example, a relative dielectric constant of the printed circuit board 46 is set to a value of approximately 4.5, while a relative dielectric constant of the dielectric member 1 is set to a value of 20 or more. In this structure, a contraction quantity of wavelengths of a reception signal due to the relative dielectric constant of the dielectric member 1 increases so that the antenna can be small.

An end of the first radiating element 2a is connected electrically via a conductor pattern 47 on the printed circuit board 46 to the end face through hole 47a that is connected to a feeding point of the main printed circuit board. The other end of the first radiating element 2a is connected electrically to an end of the first switch element 7-1 via a conductor pattern 48-1 on the printed circuit board 46.

In addition, an end of the second radiating element 2b is connected electrically to the other end of the first switch element 7-1 via a conductor pattern 48-2 on the printed circuit board 46. The other end of the second radiating element 2b is connected electrically to an end of the second switch element 7-2 via a conductor pattern 48-3 on the printed circuit board 46.

In addition, an end of the third radiating element 2c is connected electrically to the other end of the second switch element 7-2 via a conductor pattern 48-4 on the printed circuit board 46. The other end of the third radiating element 2c is connected electrically to a conductor pattern 48-5 on the printed circuit board 46.

Figure 12:
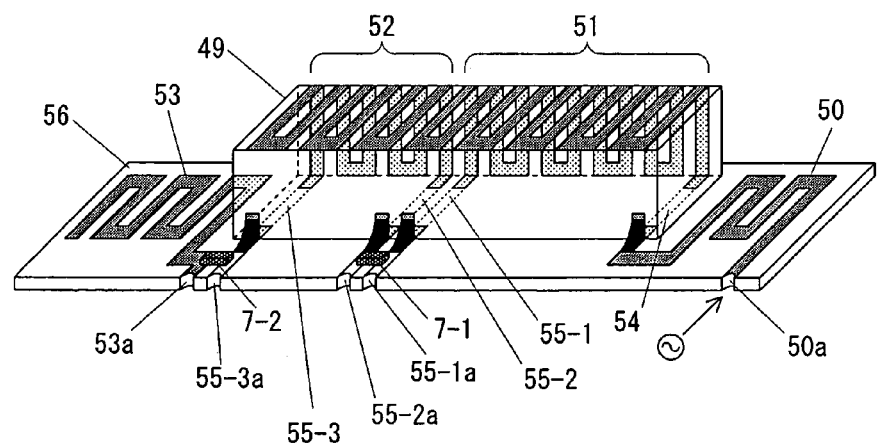
FIG. 12 is a perspective view of a whole antenna module on which an antenna is mounted according to a ninth embodiment of the present invention.

Next, an antenna according to a ninth embodiment of the present invention will be described with reference to FIG. 12. FIG. 12 is a perspective view of a whole antenna module on which an antenna is mounted according to a ninth embodiment of the present invention.

The antenna according to the ninth embodiment of the present invention includes a first radiating element that is made up of conductor patterns 50 and 54 on a printed circuit board 56 and a conductor pattern 51 on a dielectric member 49, a second radiating element 52 that is a conductor pattern on the dielectric member 49, a third radiating element 53 that is a conductor pattern on the printed circuit board 56, a first switch element 7-1, a second switch element 7-2, conductor patterns 55-1 through 55-3 on the printed circuit board 56, connection lands and soldered portions.

The printed circuit board 56 is another printed circuit board separated from the main printed circuit board on which a main electronic circuit of a small radio communication device is mounted, which has the antenna according to the ninth embodiment of the present invention. The first switch element 7-1, the second switch element 7-2, the dielectric member 49 and other components are mounted on the printed circuit board 56.

In addition, the conductor pattern 50 includes an end face through hole 50a, while the conductor patterns 55-1, 55-2 and 55-3 include end face through holes 55-1a, 55-2a and 55-3a, respectively. The third radiating element 53 that is a conductor pattern on the printed circuit board 56 includes an end face through hole 53a. The end face through hole 50a becomes a terminal of the antenna module to be connected to a feeding point. One of the end face through holes 55-1a and 55-2a becomes an antenna control terminal for entering an on/off signal while the other becomes a ground terminal if the first switch element 7-1 is made up of a PIN diode, for example. A part of components constituting a switch circuit, e.g., a resister for determining current flowing through the PIN diode, may be arranged on the printed circuit board 56 or on the main printed circuit board. The end face through holes 55-3a and 55-4a are structured similarly to the end face through holes 55-1a and 55-2a. Making the antenna as a module as shown in FIG. 12, flexibility of the antenna is increased. Although the terminals of the antenna module are made up of the end face through holes in FIG. 12, it is possible to provide a connector or the like for the terminals instead of the end face through holes.

A part of the first radiating element (the conductor pattern 51) and the second radiating element 52 are formed on the dielectric member 49 having a rectangular solid shape, and each of the conductor pattern 51 and the second radiating element 52 is a zigzag conductor pattern extending over a plurality of faces of the dielectric member 49. In addition, a dielectric constant of the dielectric member 49 is set to a value larger than a dielectric constant of the printed circuit board 56. For example, a relative dielectric constant of the printed circuit board 56 is set to a value of approximately 4.5, while a relative dielectric constant of the dielectric member 49 is set to a value of 20 or more. In this structure, a contraction quantity of wavelengths of a reception signal due to the relative dielectric constant of the dielectric member 49 increases so that the antenna can be small.

An end of the first radiating element that is made up of the conductor patterns 50 and 54 on the printed circuit board 56 and the conductor pattern 51 on the dielectric member 49 is connected electrically to the end face through hole 50a that is connected to a feeding point of the main printed circuit board. The other end of the first radiating element is connected electrically to an end of the first switch element 7-1 via a conductor pattern 55-1 on the printed circuit board 56.

In addition, an end of the second radiating element 52 is connected electrically to the other end of the first switch element 7-1 via a conductor pattern 55-2 on the printed circuit board 56. the other end of the second radiating element 52 is connected electrically to an end of the second switch element 7-2 via a conductor pattern 55-3 on the printed circuit board 56.

In addition, the third radiating element 53 is connected electrically to the other end of the second switch element 7-2.

A shown in FIG. 12, a whole or a part of the radiating elements is made up of the conductor patterns on the printed circuit board 56. Therefore, a height of the antenna module is nearly equal to a thickness of the printed circuit board 56 at the portion where a whole or a part of the radiating elements is made up of the conductor patterns on the printed circuit board 56. Thus, this structure is effective if there is a restriction of height of the antenna partially. In particular, since the portion corresponding to the end of the antenna is made up of the conductor pattern on the printed circuit board 56 as shown in FIG. 12, it is possible to realize a shape of antenna that is suitable for being housed in a roundish case (see the case 25 shown in FIG. 8, for example).

In addition, since the printed circuit board 56 is made up of a flexible printed circuit board, it is possible to realize an efficient shape of antenna that can be housed within a small space inside a small radio communication device.

Figure 13:
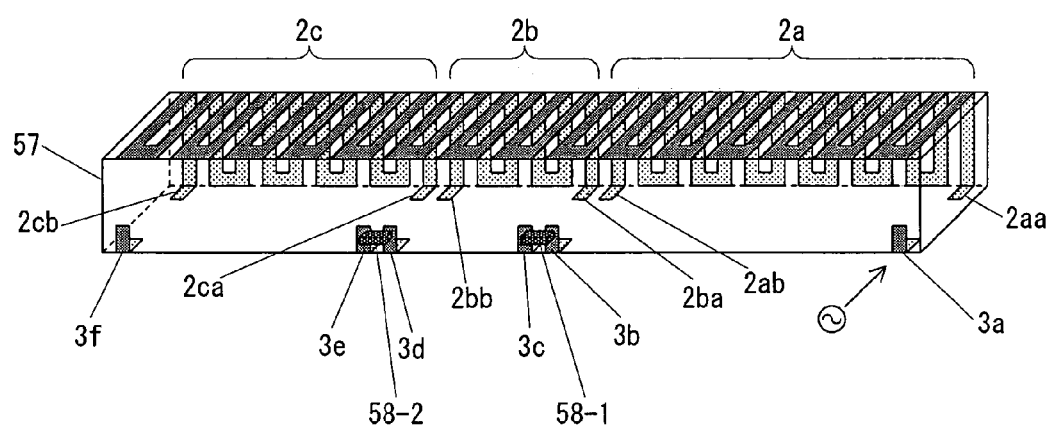
FIG. 13 is a perspective view of a dielectric member on which radiating elements are formed, which constitute an antenna according to a tenth embodiment of the present invention.

Finally, an antenna according to a tenth embodiment of the present invention will be described with reference to FIG. 13. FIG. 13 is a perspective view of a dielectric member on which radiating elements are formed, which constitute an antenna according to a tenth embodiment of the present invention.

The antenna according to the tenth embodiment of the present invention is obtained by replacing the dielectric member 1 of the antenna according to the first embodiment of the present invention with a dielectric member 57. There is a small difference between the antenna according to the first embodiment of the present invention and the antenna according to the tenth embodiment of the present invention concerning a position of conductor patterns on the printed circuit board, but a detailed description about this difference will be omitted. Since the dielectric member 57 includes a first switch element 58-1 and a second switch element 58-2, it is not necessary to provide the printed circuit board with switch elements.

The antenna according to the tenth embodiment of the present invention includes a first radiating element 2a, a second radiating element 2b, a third radiating element 2c, the first switch element 58-1, the second switch element 58-2, conductor patterns (not shown) on the printed circuit board, connection lands 3a-3f and soldered portions (not shown).

Three radiating elements (the first radiating element 2a, the second radiating element 2b and the third radiating element 2c) are formed on the dielectric member 57 having a rectangular solid shape. Each of the first radiating element 2a, the second radiating element 2b and the third radiating element 2c is formed as a zigzag conductor pattern extending on a plurality of faces of the dielectric member 57. In addition, a dielectric constant of the dielectric member 57 is set to a value larger than a dielectric constant of the printed circuit board. For example, a relative dielectric constant of the printed circuit board is set to a value of approximately 4.5, while a relative dielectric constant of the dielectric member 57 is set to a value of 20 or more. In this structure, a contraction quantity of wavelengths of a reception signal due to the relative dielectric constant of the dielectric member 57 increases so that the antenna can be small.

A connection land 2aa that is a part of the first radiating element 2a is connected electrically to a feeding point on the printed circuit board via a conductor pattern (not shown) on the printed circuit board. A connection land 2ab that is a part of the first radiating element 2a is connected electrically to an end of the first switch element 58-1 via a conductor pattern (not shown) on the printed circuit board and a connection land 3b. In addition, a connection land 2ba of the second radiating element 2b is connected electrically to the other end of the first switch element 58-1 via a conductor pattern (not shown) on the printed circuit board and a connection land 3c. A connection land 2bb of the second radiating element 2b is connected electrically to an end of the second switch element 58-2 via a conductor pattern (not shown) on the printed circuit board and a connection land 3d. In addition, a connection land 2ca of the third radiating element 2c is connected electrically to the other end of the second switch element 58-2 via a conductor pattern (not shown) on the printed circuit board and a connection land 3e.

What is claimed is:

1. An antenna comprising:
   at least two radiating elements; and
   at least one switch element for switching an electrical connection between the radiating elements;
   wherein at least one of the radiating elements is made up of conductor patterns formed on a dielectric member that is separated from a printed circuit board and has a dielectric constant larger than that of the printed circuit board, and wherein at least one switch element is mounted on the printed circuit board.

2. The antenna according to claim 1, wherein the dielectric member has a rectangular solid shape.

3. The antenna according to claim 1, wherein at least one of the radiating elements has a zigzag pattern.

4. The antenna according to claim 3, wherein the dielectric member has a polyhedral shape, and at least one of the conductor patterns has a zigzag pattern and is formed on a plurality of faces of the dielectric member.

5. The antenna according to claim 4, wherein zigzag turning points of the conductor pattern are formed on two faces that are farther from a ground pattern than other faces among a plurality of faces of the dielectric member.

6. The antenna according to claim 1, further comprising a connection land formed on the dielectric member.

7. The antenna according to claim 6, wherein a part of the conductor pattern works as the connection land for at least one of the conductor patterns.

8. The antenna according to claim 1, wherein at least two of the radiating elements are conductor patterns formed on a dielectric member that is separated from the printed circuit board and has a dielectric constant larger than that of the printed circuit board, the conductor patterns being formed on the same dielectric member.

9. The antenna according to claim 1, wherein at least one of the dielectric members has the longest side that is arranged substantially in parallel with at least one of sides constituting a rim of a ground pattern.

10. The antenna according to claim 1, wherein at least one of the radiating elements is made up of a conductive wire or a conductive plate.

11. The antenna according to claim 10, wherein at least one of the radiating elements is made up of a conductive wire or a conductive plate and constitutes an end of the antenna that is not connected to a feeding point.

12. The antenna according to claim 10, wherein the antenna is housed in a case, and at least one of the radiating elements is made up of a conductive wire or a conductive plate and has a shape adapted to the case.

13. The antenna according to claim 1, wherein at least one of the radiating elements has a stub portion.

14. The antenna according to claim 1, wherein at least one of the radiating elements has at least one of a tapered portion, a patch portion and a loop portion.

15. The antenna according to claim 1, wherein the switch element is a PIN diode that is turned on and off for switching the electrical connection between the radiating elements.

16. The antenna according to claim 1, wherein the switch element is a field effect transistor that is turned on and off for switching the electrical connection between the radiating elements.

17. The antenna according to claim 1, wherein the dielectric member is mounted on a printed circuit board that does not include a circuit for processing a signal received by the antenna, and the printed circuit board on which the dielectric member is mounted has input and output terminals for external connections.

18. The antenna according to claim 17, wherein at least one of the radiating elements has a whole or a part of the element that is formed on the printed circuit board on which the dielectric member is mounted.

19. The antenna according to claim 17, wherein the printed circuit board on which the dielectric member is mounted is a flexible printed circuit board.

20. The antenna according to claim 1, wherein at least one of the switch elements is mounted on the dielectric member.

21. An antenna comprising:
at least two radiating elements; and
at least one switch element for switching an electrical connection between the radiating elements;
wherein at least one of the radiating elements is made up of conductor patterns formed on a dielectric member that is separated from a printed circuit board and has a dielectric constant larger than that of the printed circuit board;
wherein at least two of the radiating elements have zigzag patterns having zigzag pitches different from each other.

22. The antenna according to claim 21, wherein the zigzag pitch becomes coarser as being farther from a feeding point.

23. An antenna comprising:
at least two radiating elements; and
at least one switch element for switching an electrical connection between the radiating elements;
wherein at least one of the radiating elements is made up of conductor patterns formed on a dielectric member that is separated from a printed circuit board and has a dielectric constant larger than that of the printed circuit board;
wherein at least one of the radiating elements has a zigzag pattern
wherein at least one of the radiating elements has a zigzag pattern with a nonuniform zigzag pitch.

24. The antenna according to claim 23, wherein the zigzag pitch becomes coarser as being farther from a feeding point.

25. An antenna comprising:
at least two radiating elements;
at least one switch element for switching an electrical connection between the radiating elements; and
at least one of the radiating elements has a helical pattern;
wherein at least one of the radiating elements is made up of conductor patterns formed on a dielectric member that is separated from a printed circuit board and has a dielectric constant larger than that of the printed circuit board.

26. The antenna according to claim 25, wherein at least two of the radiating elements have helical patterns having helical pitches different from each other.

27. The antenna according to claim 26, wherein the helical pitch becomes coarser as being farther from a feeding point.

28. The antenna according to claim 25, wherein at least one of the radiating elements has a helical pattern with a nonuniform helical pitch.

29. The antenna according to claim 28, wherein the helical pitch becomes coarser as being farther from a feeding point.

30. An antenna comprising:
at least two radiating elements; and
at least one switch element for switching an electrical connection between the radiating elements;
wherein at least one of the radiating elements is made up of conductor patterns formed on a dielectric member that is separated from a printed circuit board and has a dielectric constant larger than that of the printed circuit board;
wherein at least two of the radiating elements are conductor patterns formed on dielectric members that are separated from the printed circuit board and have dielectric constants larger than that of the printed circuit board, the conductor patterns being formed on different dielectric members.

31. The antenna according to claim 30, wherein at least two of the dielectric members have shapes different from each other.

32. The antenna according to claim 30, wherein at least two of the dielectric members have dielectric constants different from each other.

33. The antenna according to claim 30, wherein at least two of the dielectric members are arranged in such manner that longitudinal directions thereof are different from each other.

34. An antenna comprising:
- at least two radiating elements; and
- at least one switch element for switching an electrical connection between the radiating elements;
- wherein at least one of the radiating elements is made up of conductor patterns formed on a dielectric member that is separated from a printed circuit board and has a dielectric constant larger than that or the printed circuit board;
- wherein the conductor pattern has a portion having a width different from other conductor pattern width.

35. An antenna comprising:
- at least two radiating elements;
- at least one switch element for switching an electrical connection between the radiating elements; and
- at least one coil that is provided inside the radiating element or is connected electrically to the radiating element;
- wherein at least one of the radiating elements is made up of conductor patterns formed on a dielectric member that is separated from a printed circuit board and has a dielectric constant larger than that of the printed circuit board.

* * * * *